US008630835B2

(12) United States Patent
Tanomura

(10) Patent No.: US 8,630,835 B2
(45) Date of Patent: Jan. 14, 2014

(54) SIMULATION DEVICE, SIMULATION METHOD, AND RECORDING MEDIUM STORING PROGRAM

(75) Inventor: Masahiro Tanomura, Tokyo (JP)

(73) Assignee: NEC Corporation, Tokyo (JP)

( * ) Notice: Subject to any disclaimer, the term of this patent is extended or adjusted under 35 U.S.C. 154(b) by 75 days.

(21) Appl. No.: 13/129,341

(22) PCT Filed: Sep. 17, 2009

(86) PCT No.: PCT/JP2009/004671
§ 371 (c)(1),
(2), (4) Date: May 13, 2011

(87) PCT Pub. No.: WO2010/058507
PCT Pub. Date: May 27, 2010

(65) Prior Publication Data
US 2011/0224964 A1 Sep. 15, 2011

(30) Foreign Application Priority Data
Nov. 20, 2008 (JP) ................................. 2008-297226

(51) Int. Cl.
*G06F 17/50* (2006.01)
(52) U.S. Cl.
USPC ........................................................ 703/14
(58) Field of Classification Search
USPC ...................... 703/14, 2, 13; 716/2
See application file for complete search history.

(56) References Cited

U.S. PATENT DOCUMENTS

| 2002/0007261 A1* | 1/2002 | Ochi et al. ...................... 703/14 |
| 2003/0055613 A1* | 3/2003 | Tsai ................................... 703/2 |
| 2005/0273309 A1* | 12/2005 | Yoneyama et al. ............. 703/14 |
| 2006/0136860 A1* | 6/2006 | Boshart et al. .................. 716/18 |

FOREIGN PATENT DOCUMENTS

| JP | 2005346527 A | 12/2005 |
| JP | 2006221375 A | 8/2006 |

OTHER PUBLICATIONS

Chavez, et al. "SPICE Model of Thermoelectric Elements Including Thermal Effects", Sensor Systems Group, Departament &Enginyeria Electronica Universitat Politkcnica de Catalunya, 2000 IEEE.*
International Search Report for PCT/JP2009/004671 mailed Oct. 20, 2009.
C. C. McAndrew et al, "VBIC95, The Vertical Bipolar Inter-Company Model", IEEE Journal of Solid State Circuits, vol. 31, No. 10, Oct. 1996, pp. 1476-1483.
R. S. Vogelsong et al., "Extending Spice for Electro-Thermal Simulation", Proceedings of the IEEE 1989, Custom Integrated Circuits Conference, May 1989, pp. 21.4.1-21.4.4.
K. O. Petrosjanc et al., "Mixed electrical-thermal and electrical-mechanical simulation of electromechatronic systems using PSPICE", Proceedings of the conference on European design automation, ACM, 1994, pp. 110-115.

(Continued)

*Primary Examiner* — Kandasamy Thangavelu

(57) ABSTRACT

Provided are a device model, a recording medium storing a program, a simulation circuit, device, and method that calculate a local temperature increase in an element. The device model according to the present invention is used for a semiconductor circuit simulation and has at least two model parameters. The model parameters include an electrical model describing temperature characteristics and a thermal model describing thermal characteristics and corresponding to the electrical model.

5 Claims, 6 Drawing Sheets

(56) References Cited

OTHER PUBLICATIONS

A. R. Hefner et al., "Thermal component models for electro-thermal network simulation", Ninth Annual IEEE Semiconductor Thermal Measurement and Management Symposium, Feb. 4, 1993, pp. 88-98.

P. M. Igic et al., "Dynamic electro-thermal physically based compact models of the power devices for device and circuit simulations", Seventeenth Annual IEEE Semiconductor Thermal Measurement and Management Symposium, 2001, pp. 35-42.

M. Pedram et al., "Thermal Modeling, Analysis, and Management in VLSI Circuits: Principles and Methods", Proceedings of the IEEE, vol. 94, No. 8, Aug. 2006, pp. 1487-1501.

Wunsche, S. et al., "Electro-thermal circuit simulation using simulator coupling", IEEE Transactions on Very Large Scale Integration (VLSI) Systems, IEEE, Sep. 1997, vol. 5, No. 3, pp. 277-282.

Fukahori, K. et al., "Computer simulation of monolithic circuit performance in the presence of electrothermal interactions", Digest of Technical Papers, 1976 IEEE International Solid-State Circuits Conference, IEEE, Feb. 1976, vol. XIX, pp. 112-113.

Japanese Office Action for JP Application No. 2010-539113 mailed on Jul. 2, 2013 with Partial English Translation.

* cited by examiner

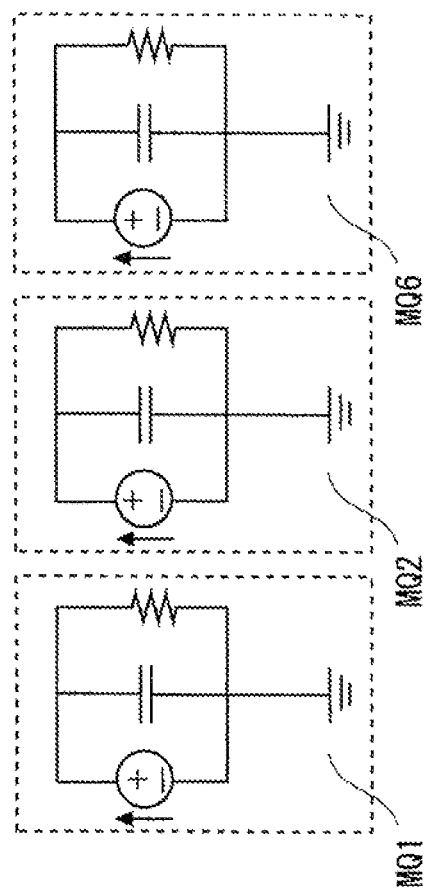
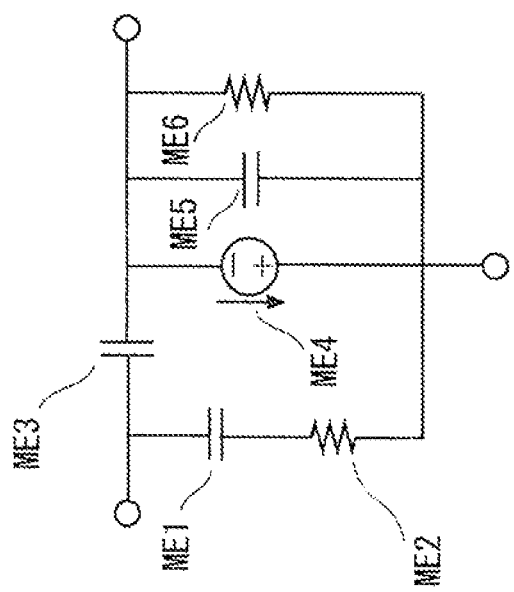
Fig. 2

SIMULATION DEVICE, SIMULATION METHOD, AND RECORDING MEDIUM STORING PROGRAM

This application is the National Phase of PCT/JP2009/004671, filed Sep. 17, 2009, which is based upon and claims the benefit of priority from Japanese patent application No. 2008-297226, filed on Nov. 20, 2008, the disclosure of which is incorporated herein in its entirety by reference.

TECHNICAL FIELD

The present invention relates to a device model, a recording medium storing a program, and a simulation circuit, device and method that calculate a temperature increase.

BACKGROUND ART

Since miniaturization of semiconductor elements has been accelerated in recent years, it has become necessary when performing a semiconductor circuit simulation to calculate a temperature increase in an element due to self-heating, especially a local temperature increase in an element, using a device model.

For example, in the case of a field effect transistor (FET), the self-heating occurs mainly at an edge of a gate electrode terminal between a gate and a drain, and the temperature of the edge of the gate electrode terminal and between the gate and the drain increases locally. As a result, the temperature of a drain resistor becomes higher than another model parameter.

A technique of a device model for simulating the self-heating as described above is disclosed (for example, Non Patent Literature 1). FIG. 7 is a view showing the technique of Non Patent Literature 1. As shown in FIG. 7, a device model of Non Patent Literature 1 includes an electrical model describing the electrical characteristics in consideration of a temperature change in an element and a thermal model describing the thermal characteristics of an element. It is thereby possible to calculate the electrical characteristics in consideration of a temperature increase in an element due to self-heating.

Further, a technique of a semiconductor circuit simulation using the above-described device model is also disclosed (for example, Patent Literature 1). In this technique, the above-described device model is used as a device model of all elements constituting a circuit in order to calculate a temperature increase in elements due to self-heating. Further, a thermal resistance value between two elements where a heat exchange occurs is calculated, and the thermal resistance value is inserted between thermal models of the device model corresponding to the two elements.

The heat exchange model is a thermal model that represents the giving and receiving of heat between elements. In this manner, according to the technique of Patent Literature 1 described above, it is possible to calculate a temperature increase in an element in consideration of not only a temperature increase in a single element due to self-heating but also an exchange of heat between elements.

Further, in relation to the semiconductor circuit simulation using the simulation circuit including the device model and the heat exchange model, a technique that models a physical phenomenon of a thermal noise and approximates a simulation value of noise characteristics at an actual measurement value by use of a gate resistor is also disclosed (for example, Patent Literature 2).

CITATION LIST

Patent Literature

Patent Literature 1: Japanese Unexamined Patent Application Publication No. 2005-346527
Patent Literature 2: Japanese Unexamined Patent Application Publication No. 2006-221375

Non Patent Literature

Non Patent Literature 1: "VBIC95, The Vertical Bipolar Inter-Company Model," IEEE JOURNAL OF SOLID STATE CIRCUITS, vol. 31, No. 10, October 1996

SUMMARY OF INVENTION

Technical Problem

However, according to the technique described in Patent Literature 1, because all electrical models constituting the device model uniformly give rise to a temperature increase at the occurrence of self-heating, a local temperature increase inside an element cannot be calculated. There is thus a problem that the simulation accuracy of device characteristics that produce self-heating is deteriorated.

FIG. 8 is a view showing small-signal characteristics calculated using actual measurement data and the device model of Patent Literature 1. As shown in FIG. 8, the actual measurement data and the result of the device model are different. When self-heating increases, a temperature between a gate and a drain increases locally, and only a drain resistance increases. Thus, when the device model is created in this region, an increase in the drain resistance does not occur in the region where self-heating is low. It is therefore necessary to reduce a source resistance that constitutes the device model to be smaller than the actual value, and, consequently, the actual measurement data and the result of the device model of the small-signal characteristics mismatch.

Further, according to the technique described in Patent Literature 1, because the heat exchange model is described in a resistive element, heat can travel in one direction only. As a result, there is a problem that it is not satisfactory as a simulation method in consideration of a heat exchange between elements in a circuit when a local temperature increase occurs inside a certain element.

On the other hand, because the model used in the technique described in Patent Literature 2 models a physical phenomenon of a thermal noise, it is composed of a resistor that produces a thermal noise and a resistor that does not produce a thermal noise which has no dependence on the resistor producing a thermal noise. Therefore, the technique of Patent Literature 2 has a problem that it is not suited to model a physical phenomenon of heat and calculate a local temperature increase inside an element without deteriorating the accuracy.

The present invention has been accomplished to solve the above problems and an object of the present invention is thus to provide a device model, a recording medium storing a program, and a simulation circuit, device and method that calculate a local temperature increase inside an element.

Solution to Problem

A device model according to the present invention is a device model used for a semiconductor circuit simulation includes at least two model parameters, in which the model parameters include an electrical model describing temperature characteristics, and a thermal model describing thermal characteristics and corresponding to the electrical model.

A simulation circuit according to the present invention includes a device model having at least two model parameters, and a heat exchange model describing a heat exchange between a plurality of thermal models describing thermal characteristics, and the model parameters include an electrical model describing temperature characteristics, and the thermal model corresponding to the electrical model.

A simulation device according to the present invention includes a device model creating means for creating a device model having at least two model parameters, the model parameters including an electrical model describing temperature characteristics and a thermal model describing thermal characteristics and corresponding to the electrical model, a heat exchange model creating means for creating a heat exchange model describing a heat exchange between a plurality of thermal models, a disposing means for disposing the device model and the heat exchange model, a connecting means for connecting the device model and the heat exchange model by an electrical wiring, and a computing means for computing a simulation value by calculating the device model, the heat exchange model, and the electrical wiring.

A semiconductor circuit simulation method according to the present invention includes a device model creating step of creating a device model having at least two model parameters, the model parameters including an electrical model describing temperature characteristics and a thermal model describing thermal characteristics and corresponding to the electrical model, a heat exchange model creating step of creating a heat exchange model describing a heat exchange between a plurality of thermal models, a disposing step of disposing the device model and the heat exchange model, a connecting step of connecting the device model and the heat exchange model by an electrical wiring, and a computing step of computing a simulation value by calculating the device model, the heat exchange model, and the electrical wiring.

A program stored in a recording medium according to the present invention causes a computer to execute processing of creating a device model having at least two model parameters, the model parameters including an electrical model describing temperature characteristics and a thermal model describing thermal characteristics and corresponding to the electrical model, processing of creating a heat exchange model describing a heat exchange between a plurality of thermal models, processing of disposing the device model and the heat exchange model, processing of connecting the device model and the heat exchange model by an electrical wiring, and processing of computing a simulation value by calculating the device model, the heat exchange model, and the electrical wiring.

Advantageous Effects of Invention

According to the present invention, it is possible to calculate a local temperature increase inside an element and thereby improve the simulation accuracy of element characteristics that produce self-heating.

BRIEF DESCRIPTION OF DRAWINGS

FIG. 2 is a view showing a device model example used for a semiconductor circuit simulation according to the exemplary embodiment;

DESCRIPTION OF EMBODIMENTS

An example of an exemplary embodiment of the present invention is described hereinafter in detail with reference to the drawings.

First Exemplary Embodiment

A device model for a semiconductor circuit simulation according to the exemplary embodiment includes two or more electrical models ME1 to MEn having temperature dependence and thermal models MQ1 to MQn indicating thermal characteristics corresponding to the respective electrical models ME1 to MEn of the element. The electrical models ME1 to MEn are composed of any one of a resistor element, a capacitor element, an inductor element, a current source element, and a voltage source element. The thermal models MQ1 to MQn are composed of a resistor element, a capacitor element, and a current source element. Thus, the model parameters that constitute the device model according to the exemplary embodiment include both of the thermal models describing thermal characteristics and the electrical models describing temperature characteristics. However, it is preferred that at least one of the model parameters is composed only of the electrical model.

Figure 1:
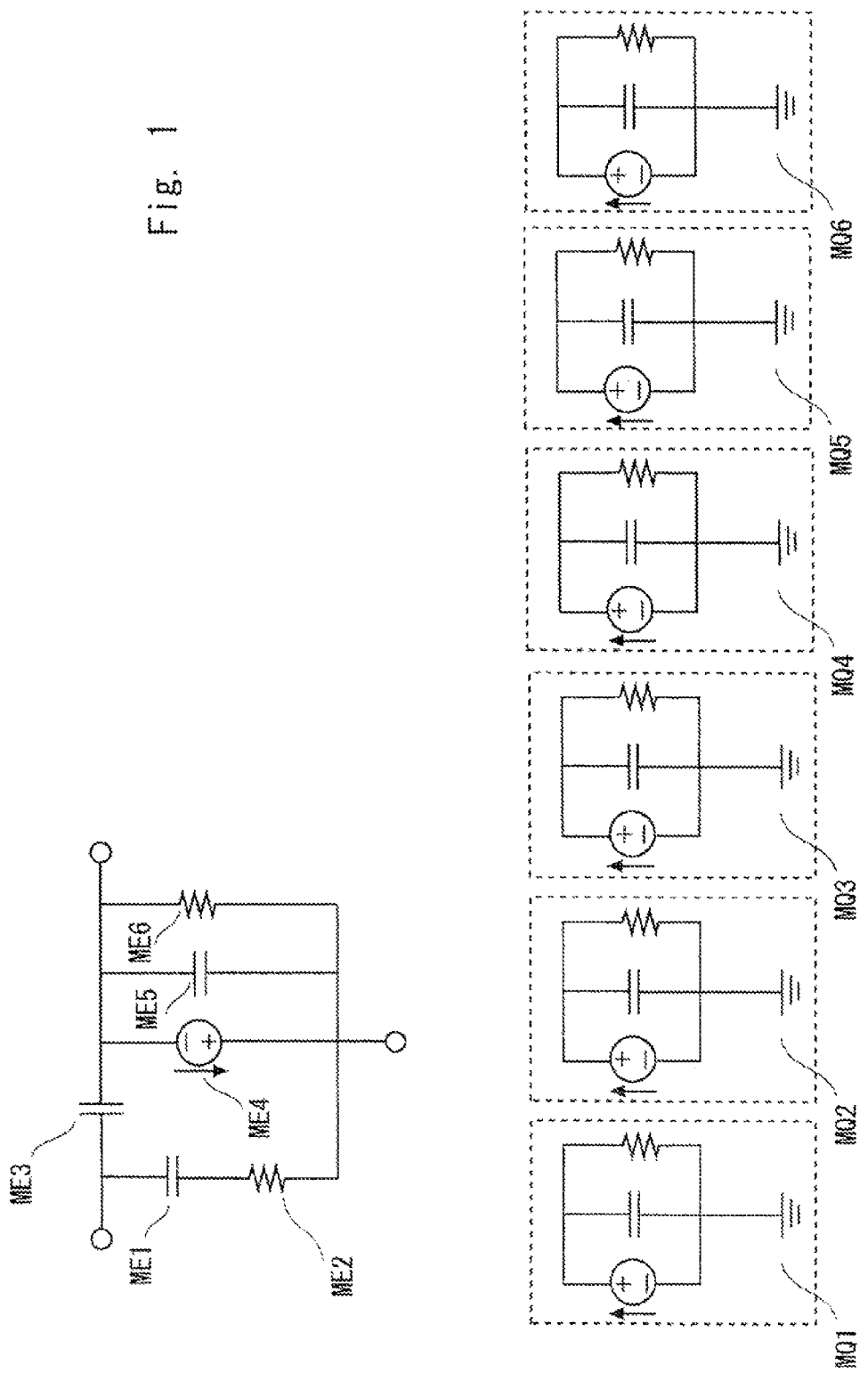
FIG. 1 is a view showing a device model example used for a semiconductor circuit simulation according to the exemplary embodiment.

FIG. 1 is a view showing a device model example used for a semiconductor circuit simulation according to the exemplary embodiment. As shown in FIG. 1, the device model includes six electrical models ME1 to ME6 and six thermal models MQ1 to MQ6 corresponding to the respective electrical models. Note that an equivalent circuit composed of the electrical models ME1 to MEn that constitute the device model shown in FIG. 1 is an example showing a π-type equivalent circuit of FET, and another equivalent circuit may be used. Further, an equivalent circuit composed of the thermal models MQ1 to MQn that constitute the device model shown in FIG. 1 is just an example, and another equivalent circuit composed of a resistor element, a capacitor element, and a current source element may be used. In this manner, the simulation circuit includes the device model including both the electrical models and the thermal models.

The electrical characteristics of the electrical models ME1 to MEn vary according to a dynamic change in the thermal characteristics of the thermal models MQ1 to MQn.

Temperatures T1 to Tn of the electrical models ME1 to MEn are defined by the following equation. In the equation, Ta is an ambient temperature, Rn is a resistance value of a resistor element constituting the thermal models MQn, j is an imaginary unit, Cn is a capacitance value of a capacitor element constituting the thermal models MQn, and Qn is a current value of a current source constituting the thermal models MQn.

$$Tn = Ta + Qn \times (Rn/(1 + j \times \omega \times Cn \times Rn)) \quad \text{Equation (1)}$$

$$\omega = 2 \times \pi \times \text{Frequency} \quad \text{Equation (2)}$$

The right-hand side of the above equation (1) indicates a temperature increase due to self-heating.

Note that the i-th and m-th thermal models in the exemplary embodiment may be the same. Further, the number of thermal models in the exemplary embodiment may be equal to or more than two and equal to or less than n as shown in FIG. 2.

As described above, according to the exemplary embodiment, each model parameter constituting the device model includes both of electrical models and thermal models. Therefore, it is possible to increase only the temperature T1 of the electrical model ME1, for example, and thus to calculate a local temperature increase inside an element. It is thereby possible to improve the simulation accuracy of element characteristics that produce self-heating.

Further, because each model parameter constituting the device model includes both of electrical models and thermal models, it is also possible to improve the accuracy of a simulation in consideration of a heat exchange between elements in a circuit when a local temperature increase occurs.

Second Exemplary Embodiment

Figure 3:
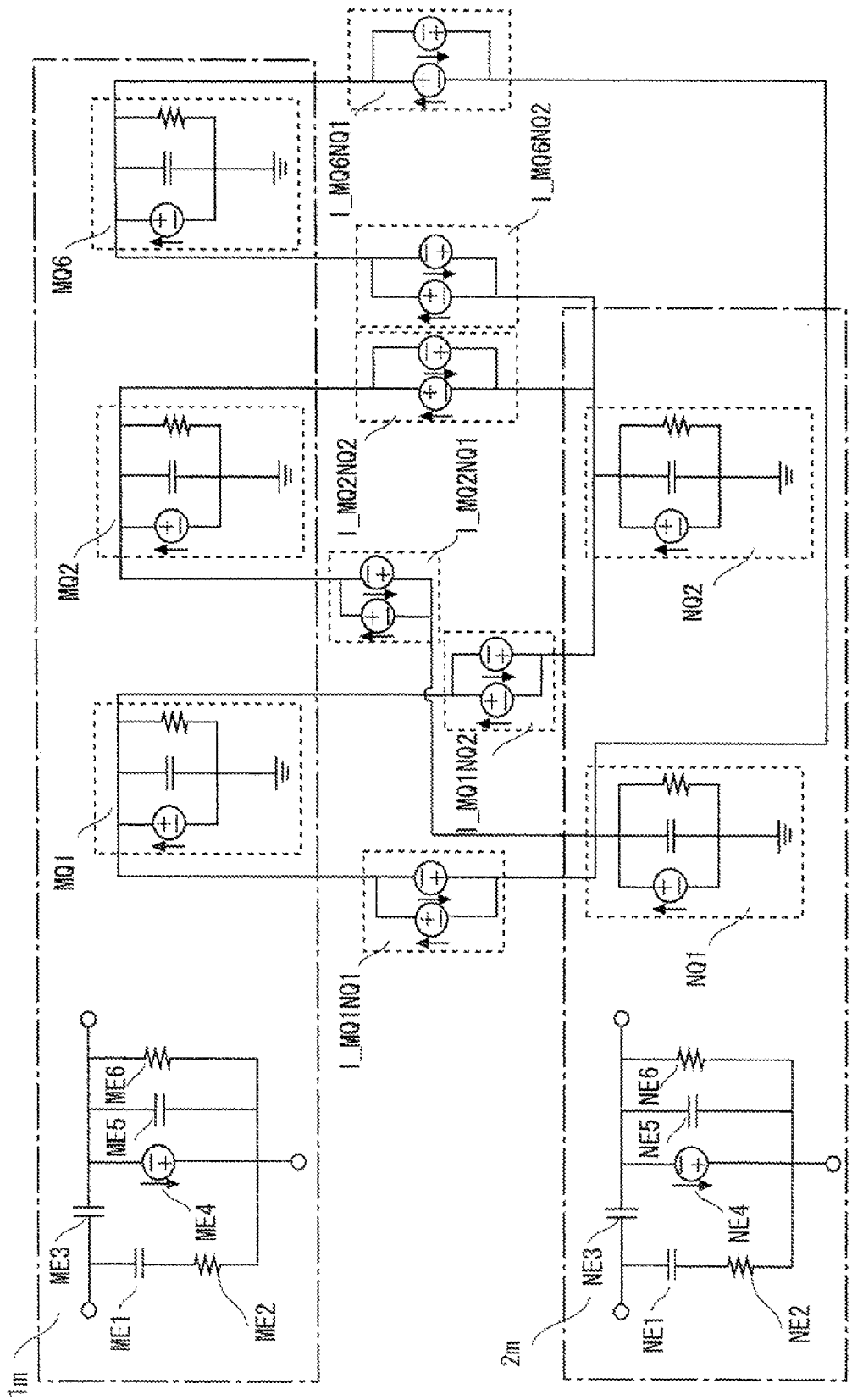
FIG. 3 is a view showing a device model example used for a semiconductor circuit simulation according to the exemplary embodiment.

FIG. 3 is a view showing a device model example used for a semiconductor circuit simulation method according to the exemplary embodiment. In this exemplary embodiment, an example of a semiconductor circuit simulation in the case of including two or more device models is described with reference to FIG. 3. Although the case of including two device models described in the first exemplary embodiment is described as an example in this exemplary embodiment, three or more device models may be included.

As shown in FIG. 3, the semiconductor circuit according to the exemplary embodiment includes device models 1m and 2m, which are similar to the device model described in the first exemplary embodiment, and the device model 1m includes three thermal models, and the device model 2m includes two thermal models. Between the respective thermal models MQ1, MQ2 and MQ6 of 1m and the respective thermal models NQ1 and NQ2 of 2m are heat exchange models I_MQ1NQ1, I_MQ2NQ1, I_MQ6NQ1, I_MQ1NQ2, and I_MQ6NQ2.

In this exemplary embodiment, the case where the number of thermal models of the device model 1m is three and the number of thermal models of the device model 2m is two is described as an example. However, the number of thermal models may be two or more, and the number is not particularly limited.

Figure 4:
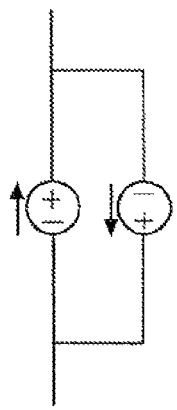
FIG. 4 is a view showing an example of a heat exchange model used for a semiconductor circuit simulation according to the exemplary embodiment.

FIG. 4 is a view showing an example of a heat exchange model used for a semiconductor simulation according to the exemplary embodiment. As shown in FIG. 4, the heat exchange model example used in this exemplary embodiment includes two current sources having different polarities. By using two current sources having different polarities as a heat exchange model, it is possible to represent the giving and receiving of heat.

According to the exemplary embodiment, it is possible to calculate a local temperature increase inside an element, and it is thereby possible to improve the simulation accuracy of element characteristics that produce self-heating. Further, by using two current sources having different polarities and connected in parallel with each other as a heat exchange model, it is possible to represent the giving and receiving of heat, and it is thereby possible to improve the accuracy of a simulation in consideration of a heat exchange.

Figure 5:
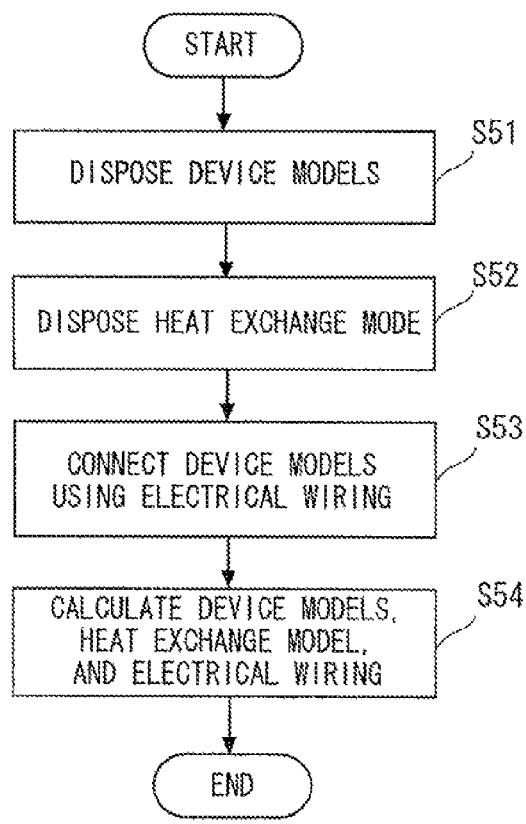
FIG. 5 is a flowchart showing an example of a flow of a semiconductor circuit simulation process according to the exemplary embodiment.

FIG. 5 is a flowchart showing an example of a flow of a semiconductor circuit simulation process according to the second exemplary embodiment. Hereinafter, an example of a flow of a semiconductor circuit simulation process is described with reference to FIG. 5, taking the case of the above-described second exemplary embodiment as an example.

First, the above-described plurality of device models are created and disposed in a computer, which is a semiconductor simulation device that carries out a semiconductor circuit simulation (Step S51). Then, a heat exchange model is created and disposed between the device models disposed in the above step S51 (Step S52).

The above-described plurality of device models are connected by an electrical wiring (Step S53), and the plurality of device models, the heat exchange model, and the electrical wiring are calculated (Step S54), thereby computing a simulation value.

Figure 6:
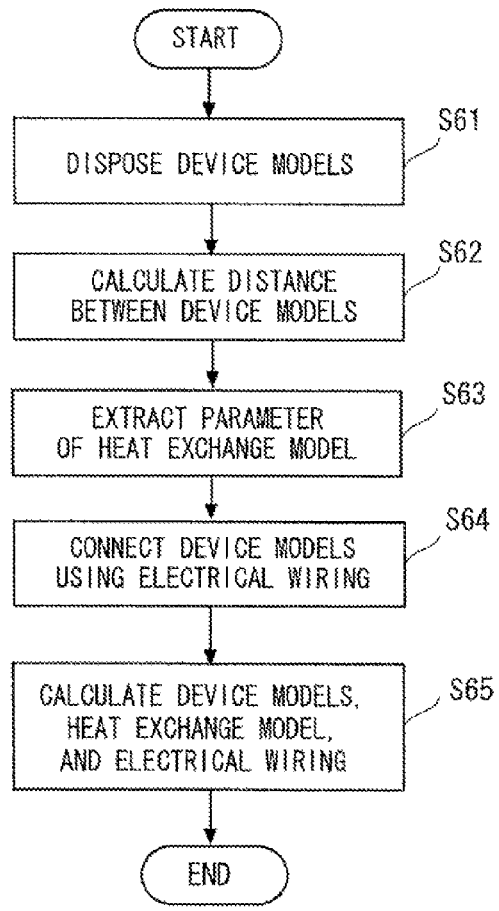
FIG. 6 is a flowchart showing an example of a flow of a semiconductor circuit simulation process according to the exemplary embodiment.
Figure 7:
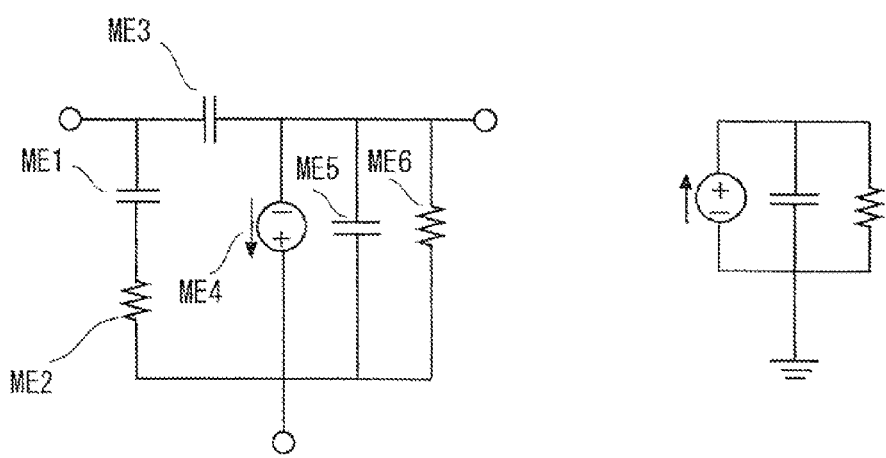
FIG. 7 is a view to illustrate Non Patent Literature 1.
Figure 8:
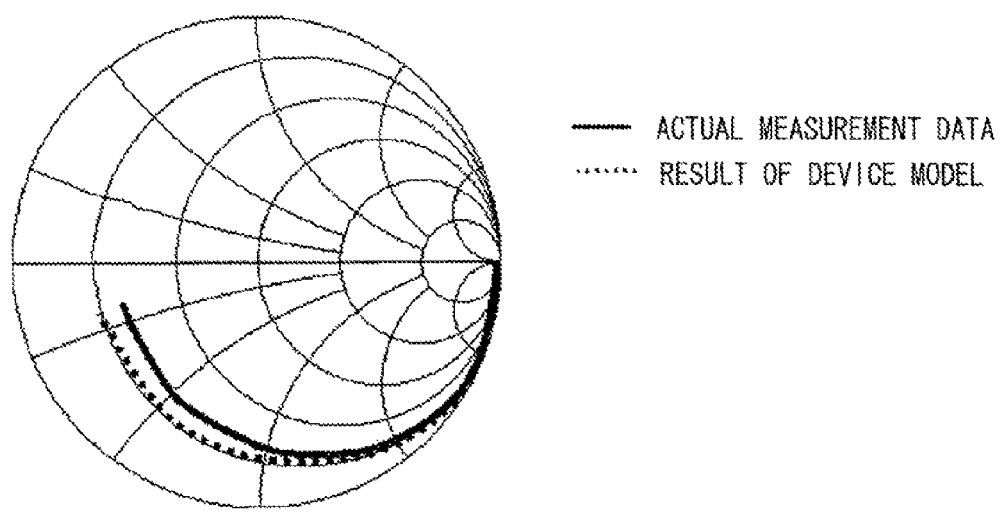
FIG. 8 is a view showing small-signal characteristics calculated using actual measurement data and a device model of Patent Literature 1.

Next, another semiconductor simulation process example according to the exemplary embodiment is described. FIG. 6 is a flowchart showing an example of a flow of a semiconductor circuit simulation process according to the second exemplary embodiment. An example of a flow of another semiconductor circuit simulation process is described with reference to FIG. 6, taking the case of the above-described second exemplary embodiment as an example.

First, the above-described plurality of device models are created and disposed in a computer, which is a semiconductor simulation device that carries out a semiconductor circuit simulation (Step S61). Then, a distance between the plurality of device models is calculated on the computer (Step S62), and a parameter of a heat exchange model is extracted based on a result of the calculated distance (Step S63).

The above-described plurality of device models are connected by an electrical wiring (Step S64), and the plurality of device models, the heat exchange model, and the electrical wiring are calculated (Step S65), thereby computing a simulation value.

Note that, although an example of a flow of a process of a semiconductor circuit simulation including a plurality of device models is described as an example in this exemplary embodiment, it is not limited thereto, and the number of device models may be one.

Further, although the present invention is described as the device model in the above-described exemplary embodiments, the present invention is not limited thereto. The present invention may be implemented by causing a CPU (Central Processing Unit) to execute a computer program to perform the process of FIGS. 5 and 6. In this case, the computer program may be stored in a recording medium and provided, or may be transmitted over a communication medium such as the Internet and provided. Examples of storage media include floppy disks, hard disks, magnetic disks, magneto-optical disks, CD-ROM, DVD, ROM cartridges, RAM memory cartridges with battery backup, flash memory cartridges, and nonvolatile RAM cartridges. Further, examples of communication media include wired communication media such as telephone lines, and wireless communication media such as microwave lines.

While the invention has been particularly shown and described with reference to exemplary embodiments thereof, the invention is not limited to the above-described device model, simulation circuit, simulation device and semiconductor circuit simulation method, program and recording medium, and it will be obvious that various changes may be made without departing from the spirit and scope of the present invention.

INDUSTRIAL APPLICABILITY

The present invention may be applied to a simulation of a semiconductor circuit where a temperature increase due to self-heating of an element occurs. Particularly, the present invention may be applied to a simulation of a semiconductor circuit where the temperature of an element increases locally.

REFERENCE SIGNS LIST 1m, 2m DEVICE MODEL
ME1 to Men ELECTRICAL MODEL CONSTITUTING DEVICE MODEL 1m
MQ1 to MQn THERMAL MODEL CONSTITUTING DEVICE MODEL CORRESPONDING TO ELECTRICAL MODEL ME1 to MEn
NE1 to NEn ELECTRICAL MODEL CONSTITUTING DEVICE MODEL 2m
NQ1 to NQn THERMAL MODEL CONSTITUTING DEVICE MODEL CORRESPONDING TO ELECTRICAL MODEL NE1 to NEn
I_MQ1NQ1 HEAT EXCHANGE MODEL DESCRIBING HEAT EXCHANGE BETWEEN THERMAL MODEL MQ1 AND THERMAL MODEL NQ1
I_MQ2NQ1 HEAT EXCHANGE MODEL DESCRIBING HEAT EXCHANGE BETWEEN THERMAL MODEL MQ2 AND THERMAL MODEL NQ1
I_MQ6NQ1 HEAT EXCHANGE MODEL DESCRIBING HEAT EXCHANGE BETWEEN THERMAL MODEL MQ6 AND THERMAL MODEL NQ1
I_MQ1NQ2 HEAT EXCHANGE MODEL DESCRIBING HEAT EXCHANGE BETWEEN THERMAL MODEL MQ1 AND THERMAL MODEL NQ2
I_MQ2NQ2 HEAT EXCHANGE MODEL DESCRIBING HEAT EXCHANGE BETWEEN THERMAL MODEL MQ2 AND THERMAL MODEL NQ2
I_MQ6NQ2 HEAT EXCHANGE MODEL DESCRIBING HEAT EXCHANGE BETWEEN THERMAL MODEL MQ6 AND THERMAL MODEL NQ2

The invention claimed is:

1. A non-transitory computer readable medium storing a simulation circuit, the simulation circuit comprising:
a device model having at least two model parameters; and
a heat exchange model describing a heat exchange between a plurality of thermal models describing thermal characteristics, wherein the model parameters include an electrical model describing temperature characteristics, and a thermal model among the plurality of thermal models corresponding to the electrical model,
wherein the heat exchange model includes two current sources having different polarities and connected in parallel between the thermal model among the plurality of thermal models in the device model and a thermal model of another device model.

2. The simulation circuit according to claim 1, wherein at least two device models and at least two heat exchange models are included.

3. The non-transitory computer readable medium storing a simulation circuit according to claim 1, wherein the device model further comprises at least a second model parameter composed only of the electrical model.

4. The non-transitory computer readable medium storing a simulation circuit according to claim 1, wherein the electrical model includes at least any one of a resistor element, a capacitor element, an inductor element, a current source element, and a voltage source element.

5. The non-transitory computer readable medium storing a simulation circuit according to claim 1, wherein the thermal model includes at least any one of a resistor element, a capacitor element, and a current source element.

* * * * *